United States Patent [19]
Walls et al.

[11] Patent Number: 6,143,143
[45] Date of Patent: *Nov. 7, 2000

[54] MASKING MEANS AND CLEANING TECHNIQUES FOR SURFACES OF SUBSTRATES

[75] Inventors: John Michael Walls; Alaric Graham Spencer; Norman Henry White; Alan Robert Waugh, all of Leicestershire, United Kingdom

[73] Assignee: Applied Vision Limited, Leicestershire, United Kingdom

[*] Notice: This patent issued on a continued prosecution application filed under 37 CFR 1.53(d), and is subject to the twenty year patent term provisions of 35 U.S.C. 154(a)(2).

[21] Appl. No.: 08/416,822
[22] PCT Filed: Aug. 16, 1994
[86] PCT No.: PCT/GB94/01795
  § 371 Date: Sep. 29, 1995
  § 102(e) Date: Sep. 29, 1995
[87] PCT Pub. No.: WO95/05494
  PCT Pub. Date: Feb. 23, 1995

[30] Foreign Application Priority Data

Aug. 18, 1993 [GB] United Kingdom .................. 9317170

[51] Int. Cl.[7] .............................. C23C 14/35; C23C 14/50
[52] U.S. Cl. .............................. 204/192.26; 204/192.12; 204/192.16; 204/298.11; 204/298.15; 204/298.19; 204/298.26; 118/500; 118/504; 118/505; 118/721; 118/728
[58] Field of Search ..................... 204/298.11, 298.15, 204/298.25, 298.26, 298.31, 298.35, 192.12, 192.16, 192.26, 192.3, 192.32; 156/345; 118/500, 504, 505, 720, 721, 728

[56] References Cited

U.S. PATENT DOCUMENTS

| | | |
|---|---|---|
| 2,271,239 | 1/1942 | Vokes ................................. 204/298.15 |
| 4,455,964 | 6/1984 | Weber .................................... 118/505 |
| 4,458,746 | 7/1984 | Holden et al. ........................... 118/728 |
| 4,512,841 | 4/1985 | Cunningham, Jr. et al. ...... 204/298.15 |
| 4,522,697 | 6/1985 | Dimock et al. .................... 204/298.15 |
| 4,636,543 | 1/1987 | Helton .................................... 427/155 |
| 4,980,197 | 12/1990 | Suhr et al. .............................. 427/259 |
| 5,164,238 | 11/1992 | Horiki et al. ........................... 118/505 |
| 5,225,057 | 7/1993 | LeFabvre et al. ................. 204/192.12 |
| 5,292,417 | 3/1994 | Kugler .............................. 204/192.13 |
| 5,370,737 | 12/1994 | Mathis .............................. 204/298.28 |
| 5,656,138 | 8/1997 | Scobey et al. ..................... 204/192.12 |

FOREIGN PATENT DOCUMENTS

| | | |
|---|---|---|
| 0 199 114B1 | 3/1986 | European Pat. Off. . |
| 0508359 | 10/1992 | European Pat. Off. . |
| 3514094 A1 | 10/1986 | Germany . |
| 2 233 983 | 1/1991 | United Kingdom . |
| WO 91/05077 | 4/1991 | WIPO . |
| WO 92/13114 | 8/1992 | WIPO . |

*Primary Examiner*—Rodney McDonald
*Attorney, Agent, or Firm*—Klauber & Jackson

[57] ABSTRACT

The invention relates to apparatus for use in the coating of surfaces of substrates by Physical Vapor Deposition systems (PVD) wherein the deposition in material is applied onto the said surfaces by the sputtering of the same using the PVD system. The invention provides means for preventing sputtering material from applying or landing onto surfaces other than which is desired to be coated in the said coating process. The masking means allow the prevention and/or removal of such material which is known as backscattered material and the invention described claims protection for several embodiments and methods of achieving this thereby improving subsequent adhesion propertied and optical quantities, if applicable, of the coating.

47 Claims, 3 Drawing Sheets

MASKING MEANS AND CLEANING TECHNIQUES FOR SURFACES OF SUBSTRATES

The invention relates to the provision of masking means for certain surfaces of substrates when other surfaces of the said substrates are coated by a Physical Vapour Deposition system (PVD) wherein the deposition of material is applied by sputtering of the material onto the surfaces to be coated.

In particular the invention relates to improvements in the application of coatings to substrates such as optical lenses and other articles of similar dimensions. The lenses can be used for many purposes, including use in spectacle frames, and may be formed from glass or a plastics material.

In any sputtering process there is a prevalence of material moving onto and around the surface of the substrate which is being coated. Although, as in the coating process described in our clients co-pending application PCT/GB92/00071, considerable control of the sputtering process can be achieved to obtain the best possible coating finish on the coated surface it has been found that it is not possible to completely control the path of the sputtered material.

To briefly describe a sputtering coating process and with reference to the applicants' machine and apparatus described in their co-pending application, there is typically provided a plurality of substrates, in this case lenses, mounted in lens holders and received in a disc holder which in this embodiment is held in a horizontal plane in a chamber. In proximity to the disc there is provided at least one magnetron and target, the target containing the material which it is desired be sputtered onto the lens, typically as an oxide, and the magnetron induces sputtering of the material when the chamber is in vacuum. Typically the machine is preprogrammed such that after the lens holders have been placed on the disc the machine is operable to apply a first "adhesion" layer of material and then at least one coating of the desired material oxide onto a surface of each of the lenses by activating sputtering of the target as the disc holder is rotated. The sputtering of the material is then followed by rotating the disc and substrates through a reactive plasma from an unbalanced magnetron which encourages a chemical reaction such as oxidation to occur in the material to arrive at the desired coating on the surface. In the case of the applicant's machine and other, similar machines, there is provided means for coating both optical surfaces of the lens wherein when the first surface of the lens is coated, the lens is turned over and the second surface is coated.

While this and sputter deposition machines in general have been found to be of commercial value it has been found that problems exist with the occurence of sputtered material landing on the second surface of the lens during sputter coating of the first surface of the lens, and vice versa. This is known as back-scattering and can cause problems once the first surface has been coated and, if required, the lens is turned over to perform the coating of the second surface of the lens. In the event of the second surface being required to be coated an adhesion layer is applied thereto and this layer will, in some instances, not adhere to the surface due to the irregularities caused by the backscattered material which has been applied therein during the coating of the first surface.

Furthermore, it has been found that the lenses which are affected by the backscattering problem can subsequently be rejected after a period of time due to inferior optical quality. The reduction in optical quality occurs over a period of time after substantial use of the lens as part of, for example, to spectacles where loss of the coating can occur and accelerated lifetime tests have shown that coating loss and poor optical quality occur on the second surface which has been subjected to back-scattering.

While the problem can exist with the coating of any lens it has been found to be particularly prevalent when lenses are mounted in position in the apparatus for coating of the surfaces and a gap exists between the second surface of the lens and the lens holder. The gap can be as little as 0.5 mm but typically a gap of more than 1 mm has been found to cause these problems. Lenses which are particularly prone to these problems are cut lenses or a lens to correct astigmatism but in general any lens can be affected, even if it is an uncut lens and the surface first coated is convex, can leave a gap through which back-scattered material can pass to deposit on the second surface of the lens during coating of the first surface.

The aim of the present invention is to provide a masking means so that the second surface of a substrate, such as a lens, is protected from receiving backscattered material during the sputtering of material to coat a first surface of the substrate. A further aim is to provide a means for masking the second surface of the lens in such a manner that the masking can be applied and removed quickly and to also provide a means for removing any backscattered material from said second surface.

The present invention relates to a masking means for use with apparatus for the coating of at least one surface of a substrate by sputter deposition of material thereon, and wherein prior to coating a first surface of said substrate by sputter deposition the said masking means and/or substrate are brought into at least partial contact to mask at least a second surface of the substrate from the deposition of material thereon.

Typically the substrate which is coated is a lens having two optical surfaces, a first and a second optical surface, and wherein during the coating of the first surface by sputter deposition the second surface is in contact with the masking means thereby preventing the same from receiving any sputtered material thereon.

In one embodiment the masking means is an adhesive membrane which is applied to the second surface prior to the coating of the first surface and then removed from the second surface to allow the coating of the same if required. Typically said membrane is in the form of an adhesive tape and said adhesive is of a type to be removable from the lens without leaving an adhesive deposition thereon. A known tape is sold under the name "Surface Saver".

In a further embodiment the masking means is a release agent which is applied to the second surface to mask the same and is easily removable upon completion of the sputtering process for coating the first surface.

One typical release agent is provided in a gel or pressurised particle spray which is applied by spraying or by any other appropriate method onto the second surface to mask the same during sputtering.

A third embodiment of the masking means is a layer of material upon which the substrate is placed, said layer insertable in, or an integral part of, the substrate holder of the sputter deposition apparatus. Typically, when the lens is in place in the holder, the layer serves to at least partially contact the second surface of the lens to protect same from back-scattered material during sputtering.

The layer is preferably formed of a material which is sufficiently deformable to allow variation in the substrate dimensions and type to be taken into account. In one preferred embodiment the layer is formed of neoprene material which takes the shape of the substrate surface placed thereon. Alternatively the layer is a foam material but in whichever material, the layer is provided in a form such that the same is part of, or as an insert into, the substrate holder, such that when the substrate is fitted into the holder, the layer is deformed to contact at least the peripheral edge of the second surface thereby masking the surface from any back-scattering which may occur. The layer can further be shaped to match the shape of the surface itself hence providing contact with the majority of the second surface.

When the substrates to be coated are standard cut sizes a further embodiment is to provide a substrate holder in the form of a cullotte, said cullotte including location means for said substrates and formed such that when the substrates are put in position the apertures are sealed and hence no sputtered material can pass through to the second surface which is not being coated hence preventing back scattering.

Preferably at each location means there is provided a lip, which need not be deformable, said lip arranged to lie adjacent to, or in contact with, the edges of the substrate, when the same is placed in the cullotte location means thereby ensuring an improved seal between the cullotte and the substrate.

In an alternative embodiment and when the apparatus is used for coating of substrates of different sizes, the lips are movably mounted such that the same can be moved to contact with the edges of the substrate.

Typically the sputter deposition apparatus is PVD apparatus comprising at least one sputter magnetron for the reactive sputtering of material onto the first surfaces of the substrates and a reaction zone wherein a plasma, glow discharge, ion source or other reaction means causes a reaction to occur in the sputter deposited material to form the required coating composition.

The invention also provides a method for the coating by PVD of an optical surface of a lens comprising the steps of;
placing the lens in a holder such that a first surface to be coated is exposed to the sputter deposition apparatus;
applying a masking means to a second surface of the lens to prevent sputter deposition of material thereon;
activating the sputter deposition apparatus to provide an adhesion layer and the required coating to the first surface; removing the lens from the holder; and
exposing the second surface of the lens by removing the same from the masking means.

In one embodiment when both the first and second surfaces are to be coated the method includes the further steps of placing the lens in a holder with the second surface exposed to the sputter apparatus, operating the sputter apparatus to deposit an adhesion layer and the required coating material on the second surface.

In a further aspect of the invention there is provided apparatus for the coating of surfaces of substrates by sputter deposition of material thereon, said apparatus provided for the coating of at least a first surface of said substrates and wherein the apparatus includes means for the removal of material deposited on any surfaces other than said first surface, by any of chemical etching, plasma treatment or further sputtering by ion bombardment.

In one embodiment the apparatus includes an ion source and sputtering from the ion source onto the surfaces of the substrate is used to clean the back-scattered material to leave a regular surface for the application of an adhesion layer and subsequent coatings thereon. The sputtering is preferably provided as an integral part of the coating process.

The method for cleaning surfaces of backscattered material comprises the step of applying a coating by sputter deposition to a first surface of a substrate, such as a lens having two surfaces to be coated, held in a holder, removing the lens from the holder, exposing the second surface to the sputter apparatus and operating the sputter apparatus in a cleaning mode to remove backscattered material on said second surface.

A specific embodiment of the invention will now be described with reference to the accompanying drawings wherein.

Figure 1:
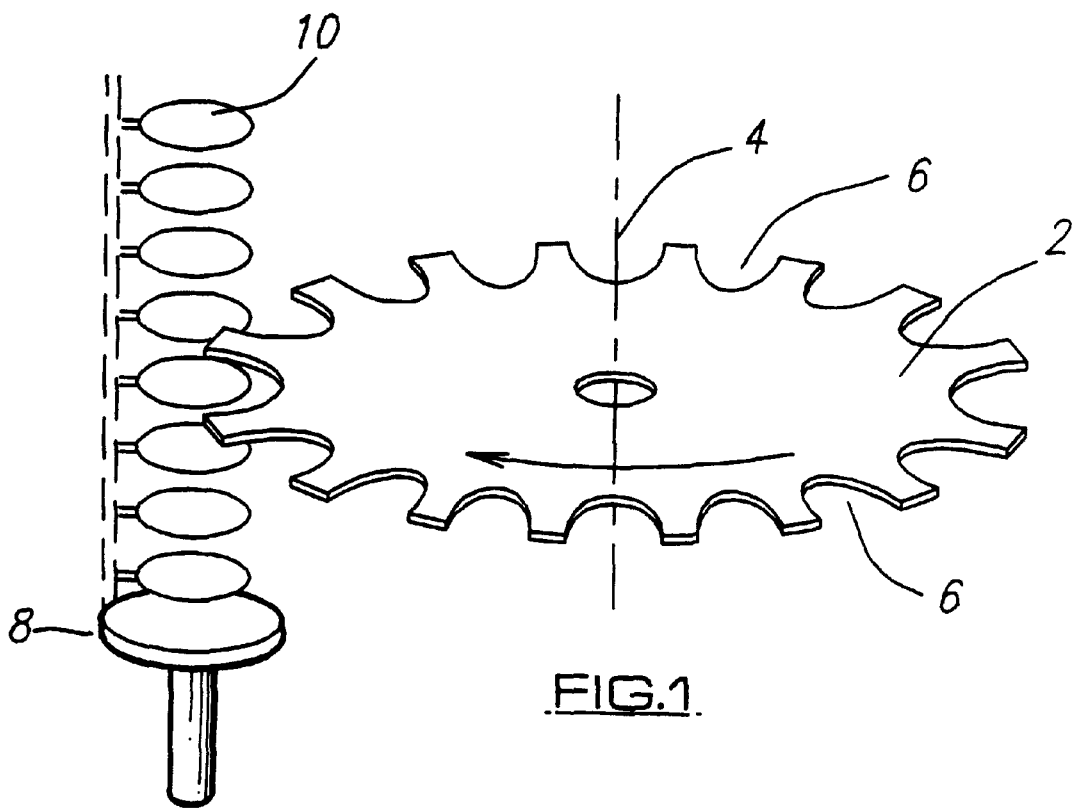
FIG. 1 illustrates a conventional disc and lens holder.
Figure 2:
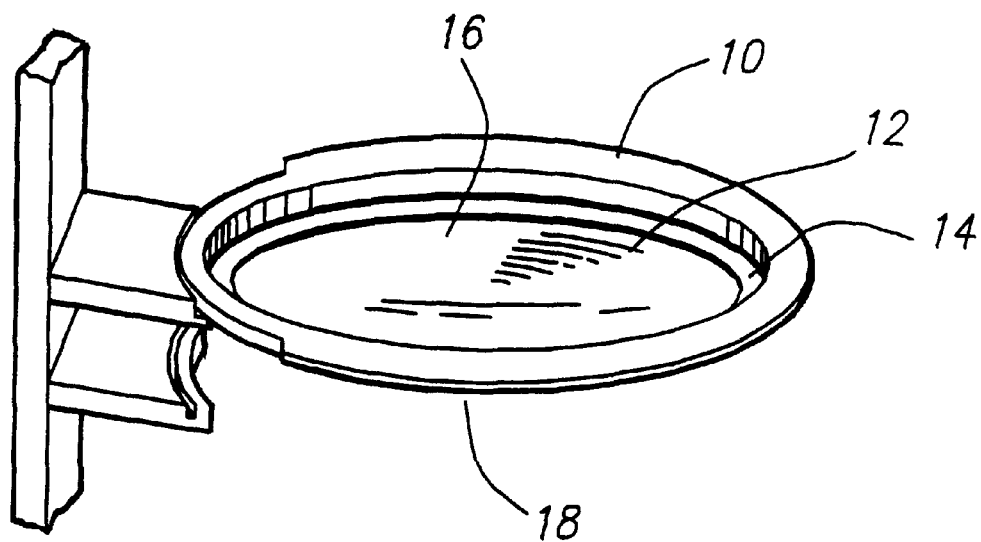
FIG. 2 illustrates a lens being held in a holder.

Referring firstly to FIG. 1 there is illustrated a disc 2 which is disposed for rotation about a central axis 4. Provided around the periphery of the disc are a series of indents of similar dimension. Provided adjacent to the disc in a magazine 8 are a plurality of lens holders 10 each of which carries a lens 12 as shown in FIG. 2. During operation of the machine, within which the disc and the lens holders shown are located, holders are picked up by the disc to fill all the indents 6 available following which the disc is rotated and the lens held thereon coated by sputtered material from sputter deposition apparatus and reaction means past which the substrates are repeatedly rotated.

Figure 3:
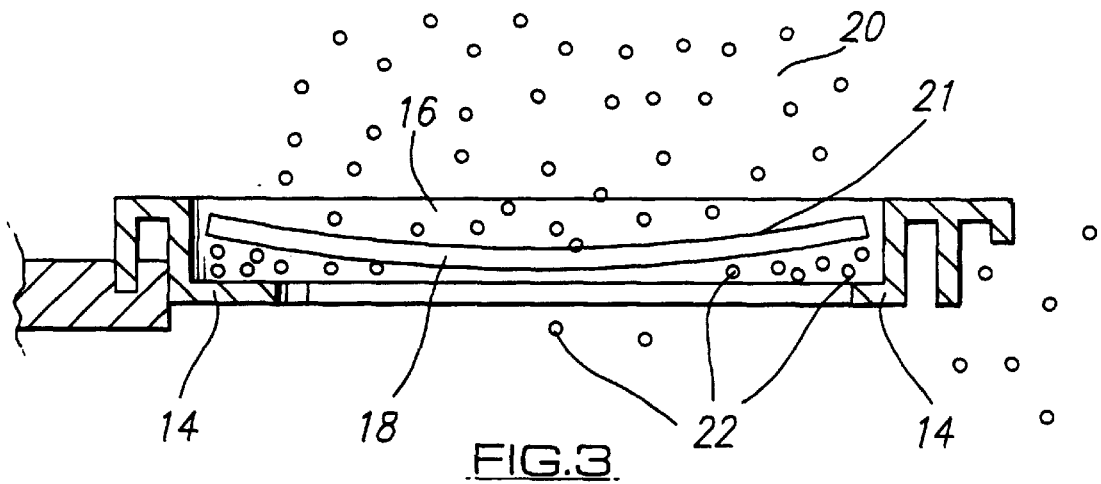
FIG. 3 illustrates the sputtering of a first surface of the lens in diagrammatic form.

FIG. 2 illustrates the lens holder 10 in greater detail and the holder includes a lower flange 14 upon which the lens sits during coating. The lens can be shaped and in this case consists of a concave surface 16 and a convex surface 18. FIG. 3 illustrates the sputtering of the first surface 16 of the invention which in this case is the concave surface of the lens but which may equally be the convex surface if required, by the deposition of material 20 thereon to form a coating 21 thereon. The depth of coating and the number of types of coating can be altered to suit requirements and the actual apparatus and control methods are disclosed in greater detail in the co pending application referred to earlier in the specification.

Although attempts are made to control the path of the sputtered material 20 it has been found that there is still opportunity for material to be deposited on areas which are not required to be coated as shown by the material 22. This is known as back-scattering and FIG. 3 clearly shows how this back-scattering can lead to the deposition of material on the second surface 18 of the lens. This makes any subsequent coating of the second surface 18 very difficult, due to the reduction in adhesion of the adhesion layer to the lens surface caused by the back-scattered material.

Figure 4:
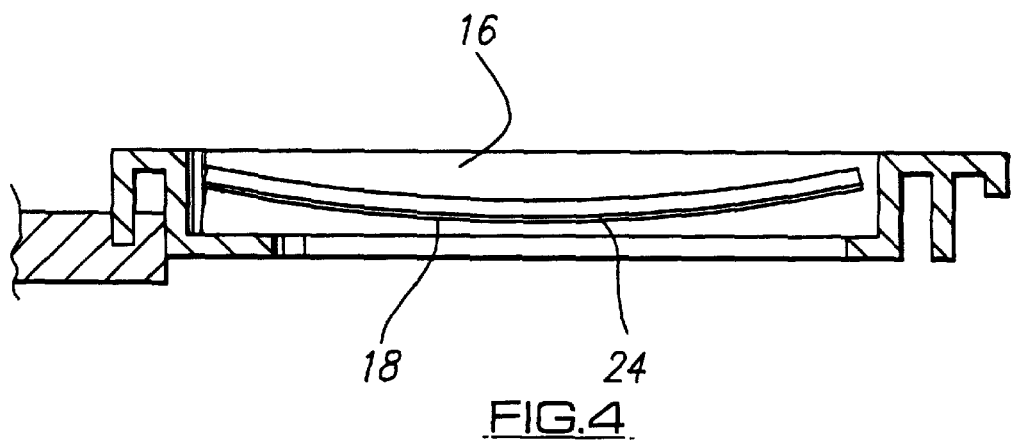
FIG. 4 illustrates a cross section of a lens holder with the second surface masked according to one embodiment of the invention.

FIG. 4 illustrates one method of overcoming this problem wherein the second surface 18 is masked from any back-scattering by the application of a protective layer 24 prior to the sputtering process. This layer can be any of an adhesive membrane, a release agent or a gel like material but in any case is easily removable upon the completion of sputtering.

Figure 5:
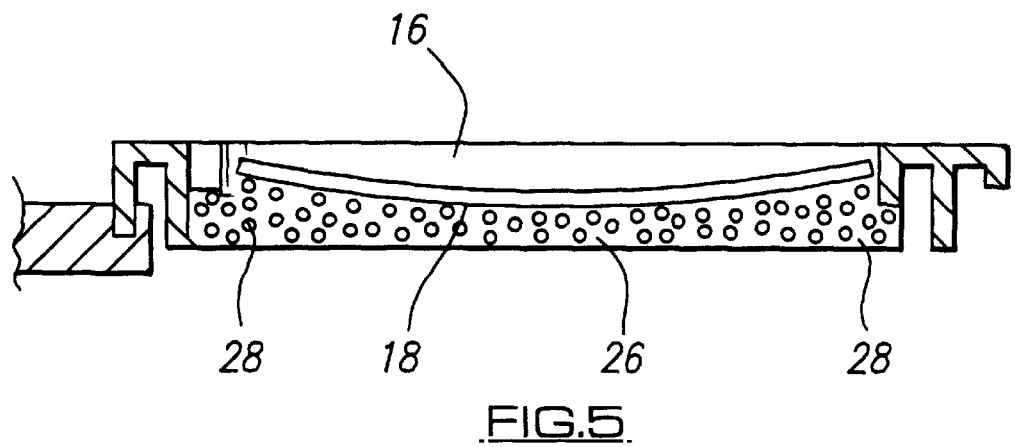
FIG. 5 illustrates a cross section of a lens holder and a lens with a masking means according to a second embodiment of the invention.

FIG. 5 illustrates an alternative embodiment for masking the second surface of the lens during sputtering wherein the lens holder 10 is provided with a layer of deformable material 26 in the form of a shaped foam layer. The foam layer may comprise a foam based plastics material. As shown, the layer is of sufficient size such that when the lens is in fitted position it causes the foam 26 to deform 28 and hence seal the second surface from damage from back-scattering.

Figure 6:
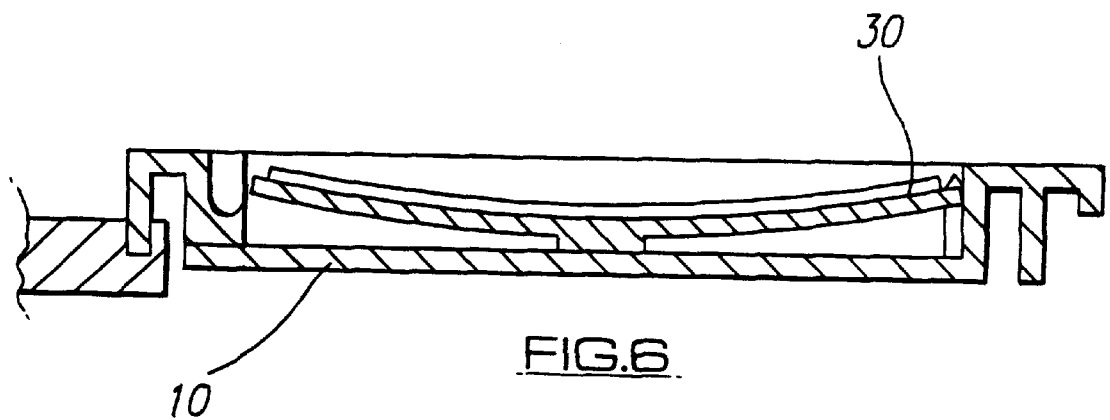
FIG. 6 illustrates a cross section of a lens holder and a lens with a masking means according to a third embodiment of the invention.
Figure 7:
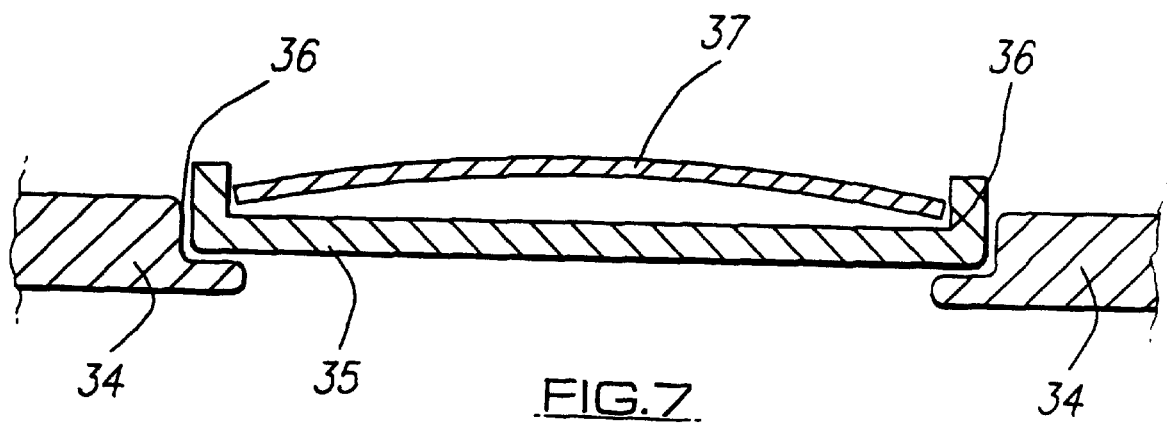
FIG. 7 illustrates a cross section of a lens holder and masking means in a further embodiment of the invention.

FIG. 6 illustrates a further embodiment wherein the holder 10 includes a layer 30 of neoprene material onto which the lens is placed. The layer 30 adapts in form to match the form of the second surface of the lens and thus the same is masked from backscattered material. A further embodiment as in FIG. 7 is particularly useful when the deposition apparatus is for use to coat a lens and is provided with a cullotte 34 to carry lenses of standard sizes which typically are uncut stock lenses which tend to come in standard diameters e.g. 65 mm, 70 mm, 75 mm, 80 mm. The cullotte includes a plurality of apertures for the reception of location means 35 for the lenses 37 and preferably adjacent each location there is provided a lip 36 which is designed to engage with the lens edges to prevent backscattered material from entering the protected surface. When the lenses are in position for coating there is no way for the sputtered material to pass through to the surface which is not being coated, therefore no apertures are present in the cullotte and hence the occurrence of back scattering is prevented.

By utilising any of the masking methods so described the second surface of the lens can be protected during coating of the first surface by sputtering. By protecting the second surface the user reduces the opportunity for optical defects of the second surface to occur and, if the second surface is required to be coated, ensures that there will be no deposition thereon to effect the adhesion of said second coating.

As an alternative to the above masking means, as part of the automatic lens coating process of the sputter deposition apparatus, a stage is included in the coating process for the specific purpose of removing any back-scattered material from the second surface prior to the coating of said second surface. Such removal is in one embodiment, achieved by the directing of sputtered material from, for example, an ion source included as part of the apparatus onto the second surface. The sputtering of said ion source will cause any back-scattered material on the second surface to be removed and in this embodiment there is the added advantage that no masking of the second surface is required.

The sputter removal of the backscattered material can be achieved using either inert gas ion bombardment or by using reactive ion etching using a chemically active gas species. In reactive ion sputtering the removal operation works by converting the surface backscattered material into a volatile gaseous compound thereby removing the same. In sputter cleaning using inert gas ion bombardment the backscattered material is physically removed by the impact of energetic inert gas ions. Sputter removal occurs when the ion source energy exceeds the sputtering threshold of 40 eV. The efficiency of the process is improved as the ion energy is increased although substrate damage also increases with increasing ion energy. The optimum ion energy for this process is in the region 80 eV to 200 eV.

Whichever embodiment is used it has clearly been identified that back-scattering of material onto a surface which is subsequently to be coated creates problems during the actual coating of that surface and can cause adhesion problems during use of the lens. The invention of this application provides solutions to this problem which eliminate the opportunity for backscattered material to cause defects in the coating of lens surfaces.

What is claimed is:

1. A method for preventing the backscattered deposition of at least one sputter material onto a first surface of at least one substrate having a plurality of surfaces during the coating of a second surface of the substrate when placed in a carrier adapted for movement within a vacuum chamber with the at least one sputter material by a sputter deposition apparatus, comprising the steps of:

sealing the first surface of the at least one substrate while exposing the second surface of the at least one substrate;

said sealing of the first surface includes contacting in a sealing engagement a first sealing area with an adhesive material or release agent to mask the first surface, said first sealing area being selected from the group consisting of:

at least a periphery of said first surface, a peripheral edge of said substrate, and at least a periphery of said first surface and a peripheral edge of said at least one substrate;

activating the sputter deposition apparatus in said vacuum chamber, thereby sputtering the at least one sputter material toward the at least one substrate and coating the second surface of the at least one substrate with the at least one sputter material;

unsealing the first surface of the at least one substrate, whereby the second surface is coated with the at least one sputter material and the first surface is substantially devoid of the at least one sputter material;

activating the sputter deposition apparatus, thereby sputtering the at least one sputter material toward the at least one substrate and coating the first surface of the at least one substrate with the sputtered material, whereby the second surface and the first surface are sequentially coated.

2. The method according to claim 1 further comprising:

sealing the second surface of the at least one substrate while exposing the first surface of the at least one substrate to the at least one sputter material; and said sealing of the second surface includes contacting in a sealing engagement a second sealing area with a masking material to mask said second surface, said second sealing area being selected from the group consisting of:

at least a periphery of said second surface, a peripheral edge of said substrate, and at least a periphery of said second surface and a peripheral edge of said substrate.

3. The method according to claim 2 further comprising sealing the second surface of the at least one substrate before exposing the first surface of the at least one substrate to the at least one sputter material.

4. The method according to claim 2 further comprising coating the first surface with a respective sputter material which is different from the sputter material coating the second surface.

5. The method according to claim 1 further comprising placing the at least one substrate in a substrate holder wherein one of the first or second surfaces is exposed to the at least one sputter material and wherein one of said first or second surfaces is masked.

6. The method according to claim 1 further comprising causing a reaction to occur in the sputtered material.

7. The method according to claim 6 further comprising initiating said reaction by a plasma reaction means, a glow discharge reaction means, or an ion source reaction means.

8. The method according to claim 6 further comprising producing said reaction by one of a plasma reaction means, a glow discharge reaction means, and an ion source reaction means.

9. The method according to claim 1 wherein said adhesive material further comprises a removable adhesive tape.

10. The method according to claim 1 wherein said release agent is a material selected from the group consisting of gel and pressurized particle foam.

11. The method according to claim 1 further comprising providing a support layer, wherein the at least one substrate rests upon the support layer during the coating of the second surface.

12. The method according to claim 11 further comprising contacting at least the peripheral edge of the first surface of the at least one substrate with said support layer.

13. The method according to claim 11 further comprising a substrate holder wherein said support layer is integral with said substrate holder.

14. The method according to claim 11 further comprising removably engaging said support layer with a substrate holder.

15. The method according to claim 11 wherein said support layer is made from a deformable material.

16. The method according to claim 18 wherein said deformable material is a material selected from the group consisting of neoprene and a foam-based plastics material.

17. The method according to claim 1 further comprising:
providing a plurality of substrate locating means, wherein each locating means is adapted to hold a respective substrate, and wherein each substrate locating means has at least one lip for engaging an edge of the respective substrate; and
providing a substrate receiving means for receiving said plurality of substrate locating means.

18. The method according to claim 1 wherein the at least one substrate is an optical lens.

19. The method according to claim 18 wherein the optical lens comprises at least one concave surface.

20. The method according to claim 18 wherein the optical lens comprises at least one convex surface.

21. The method according to claim 1 wherein at least one of said first and second surfaces is curved.

22. The method according to claim 21 wherein at least one of said first and second surfaces is concave.

23. The method according to claim 21 wherein at least one of said first and second surfaces is convex.

24. A sputter deposition system for coating at least one surface of at least one substrate by sputter deposition, said system comprising:
a holder for mounting said at least one substrate in a vacuum chamber;
at least one sputtering device for sputtering a material onto said at least one surface of said at least one substrate exposed to said sputtering device;
wherein said at least one substrate when mounted in said holder has an exposed surface and a masked surface opposing said exposed surface which is exposed to said sputtering device and at least one of said exposed and masked surface has a shape selected from the group consisting of concave, convex, and concave and convex;
means for masking said masked surface of said at least one substrate and preventing the deposition of said sputtered material onto said masked surface; and
said masking means being adapted in relation to said at least one substrate to contact at least a peripheral edge of said substrate and thereby prevent the deposit of sputtered material onto the surface which is masked;
wherein said masking means is an adhesive membrane.

25. A system according to claim 24 wherein said at least one substrate is a plurality of substrates and said masking means is provided for each of said plurality of substrates placed in said vacuum chamber.

26. A system to claim 24 wherein said adhesive membrane is a releasable adhesive tape.

27. A system according to claim 24 including a means for creating a reaction zone within the vacuum chamber.

28. A system according to claim 27 wherein said means for creating said reaction zone is selected from the group consisting of a plasma creating means, a glow discharge and an ion source.

29. A system according to claim 28 wherein at least two magnetrons are provided having different target materials to allow a multilayered coating to be applied to the at least one substrate.

30. A system according to claim 24 said at least one substrate is an optical lens.

31. A system according to claim 24 wherein said at least one sputtering device is a magnetron including a target of a selected material to be deposited on said exposed surface of said at least one substrate.

32. A sputter deposition system for coating at least one surface of at least one substrate by sputter deposition, said system comprising:
a holder for mounting said at least one substrate in a vacuum chamber;
at least one sputtering device for sputtering a material onto said at least one surface of said at least one substrate exposed to said sputtering device;
wherein said at least one substrate when mounted in said holder has an exposed surface and a masked surface opposing said exposed surface which is exposed to said sputtering device and at least one of said exposed and masked surface has a shape selected from the group consisting of concave, convex, and concave and convex;
means for masking said masked surface of said at least one substrate and preventing the deposition of said sputtered material onto said masked surface; and
said masking means being adapted in relation to said at least one substrate to contact at least a peripheral edge of said substrate and thereby prevent the deposit of sputtered material onto the surface which is masked;
wherein said masking means is a release agent.

33. A system according to claim 32 wherein said release agent is a gel or pressurized particle foam applicable by spraying.

34. A sputter deposition system for coating at least one surface of at least one by sputter deposition, said system comprising:
a holder for mounting said at least one substrate in a vacuum chamber;
at least one sputtering device for sputtering a material onto said at least one surface of said at least one substrate exposed to said sputtering device;
wherein said at least one substrate when mounted in said holder has an exposed surface and a masked surface opposing said exposed surface which is exposed to said sputtering device and at least one of said exposed and masked surfaces has a shape selected from the group consisting of concave, convex, and concave and convex;
means for masking said masked surface of said substrate and preventing the deposition of said sputtered material onto said masked surface; and said masking means being adapted in relation to said at least one substrate to contact at least a peripheral edge of said substrate and thereby prevent the deposit of sputtered material onto the surface which is masked;

wherein said masking means is a layer of material onto which a seal area contacts, said seal area is of the group consisting of:

at least a periphery of the said masked surface;

a peripheral edge of said at least one substrate; and at least a periphery of the said masked surface and a peripheral edge of said at least one substrate.

35. A system according to claim 34 wherein said material layer is provided as an integral part of said holder.

36. A system according to claim 35 wherein said material layer is a deformable material.

37. A system according to claim 34 wherein said material layer acts as said holder and said system includes a plurality of said holders mounted on a carrier provided in said vacuum chamber.

38. A system according to claim 37 wherein said material layer is a deformable material.

39. A system according to claim 37 wherein said carrier includes a plurality of location means for receiving a plurality of substrates therein.

40. A system according to claim 39 characterized in that each location means includes a lip around the periphery thereof which contacts with a contact area and said lip acts as a means to mask the opposing surface of the at least one substrate from the deposition of sputtered material thereon, said contact area is of the group consisting of:

the periphery of the said opposing surface;

the edge of the at least one substrate mounted thereon; and the periphery of the said opposing surface and the edge of the at least one substrate mounted thereon.

41. A system according to claim 34 wherein said material layer is a deformable material.

42. A system according to claim 41 wherein said deformable material is selected from the group consisting of neoprene and a foam based plastics material.

43. A method for coating a surface of each of a plurality of substrates, each having at least a surface having a shape selected from the group consisting of concave, convex and concave and convex, said method comprising the steps of:

placing said substrates in a carrier adapted for movement in a vacuum chamber;

operating at least one sputter deposition device in said vacuum chamber to apply a sputtered material to an exposed surface of each of said substrates;

masking a masked surface opposing said exposed surface of each of said substrates prior to operation of the sputtering device; and said masking includes contacting a masking area with a masking means to mask said surface, said masking area is of the group consisting of:

at least a periphery of said masked surface, a peripheral edge of said substrate, and at least a periphery of said masked surface and a peripheral edge of said substrate;

such that when said sputtering device is operated said masking means simultaneously prevents the deposition of said sputtered material onto said masked surface of each of said substrates;

wherein said masking includes applying said masking means to said substrates prior to said substrates being placed onto said carrier for said vacuum chamber and said masking means is in the form of any of an adhesive membrane or release agent.

44. A method according to claim 43 including the step of providing a means for creating a reaction of said sputtered material on said substrates.

45. A method according to claim 43 wherein said placing includes mounting each substrate on a substrate holder and said substrate holders are mounted on the carrier for the vacuum chamber.

46. A method according to any of the preceding claims 44–45 wherein when the coating of the exposed surface of each of the substrates is complete the substrates are removed from the carrier in the vacuum chamber and then replaced on the same such that the previously opposing masked, surfaces of the substrates are exposed for coating by the sputter deposition of material thereon.

47. A method according to claim 46 wherein the previously exposed coated surface of each of the substrates are masked by bringing the same into contact with the masking means such that a coated area is contacted with the masking means, said coated area is of the group consisting of:

at least the periphery, edge of the surface, and at least the periphery and edge of the surface.

* * * * *